(12) United States Patent
Seo

(10) Patent No.: US 7,642,547 B2
(45) Date of Patent: Jan. 5, 2010

(54) LIGHT EMITTING DEVICE AND METHOD OF MANUFACTURING THE SAME

(75) Inventor: Seong Moh Seo, Suwon-si (KR)

(73) Assignee: LG. Display Co., Ltd., Seoul (KR)

( * ) Notice: Subject to any disclaimer, the term of this patent is extended or adjusted under 35 U.S.C. 154(b) by 204 days.

(21) Appl. No.: 11/639,840

(22) Filed: Dec. 14, 2006

(65) Prior Publication Data

US 2007/0267641 A1 Nov. 22, 2007

(30) Foreign Application Priority Data

May 17, 2006 (KR) ...................... 10-2006-0044349

(51) Int. Cl.
*H01L 29/08* (2006.01)

(52) U.S. Cl. .............................. 257/40; 257/59; 257/72; 257/79; 257/642; 257/E27.111; 257/E27.117; 257/E51.018; 257/E51.022

(58) Field of Classification Search .................... 257/40, 257/59, 72, 79, 642, E27.111, E27.117, E51.018, 257/E51.022
See application file for complete search history.

(56) References Cited

U.S. PATENT DOCUMENTS

| | | | | |
|---|---|---|---|---|
| 6,114,715 | A | * | 9/2000 | Hamada ....................... 257/72 |
| 7,315,293 | B2 | * | 1/2008 | Ha et al. ....................... 345/83 |
| 2004/0142502 | A1 | | 7/2004 | Yoo et al. |
| 2006/0119251 | A1 | * | 6/2006 | Kim ........................... 313/500 |

FOREIGN PATENT DOCUMENTS

| JP | 2002-261291 A | 9/2002 |
|---|---|---|
| JP | 2002-350899 A | 12/2002 |
| JP | 2004-63286 A | 2/2004 |
| JP | 2004-96100 A | 3/2004 |

OTHER PUBLICATIONS

Office Action issued in corresponding Japanese Patent Application No. 2006-332181; issued Jul. 7, 2009.

* cited by examiner

*Primary Examiner*—Andy Huynh
(74) *Attorney, Agent, or Firm*—Brinks Hofer Gilson & Lione

(57) ABSTRACT

A light emitting device and a method of manufacturing the same are provided. The light emitting device comprises a substrate, a gate electrode positioned on the substrate, a first insulating layer positioned on the substrate comprising the gate electrode, an amorphous silicon layer positioned on the first insulating layer so that a predetermined area thereof corresponds to the gate electrode, ohmic layers that positioned on a predetermined area of the amorphous silicon layer, the ohmic layers defining a source area and a drain area, a source electrode or a drain electrode electrically connected to any one of the ohmic layers and a cathode that is electrically connected to the other one of the ohmic layers, a second insulating layer positioned on the substrate comprising the source electrode or the drain electrode and the cathode, the second insulating layer comprising an opening exposing a portion of the cathode, an emitting layer positioned within the opening, and an anode positioned on the substrate comprising the emitting layer.

13 Claims, 4 Drawing Sheets

LIGHT EMITTING DEVICE AND METHOD OF MANUFACTURING THE SAME

This Non-provisional Application claims priority under 35 U.S.C. §119(a) on Patent Application No. 10-2006-0044349, filed on May 17, 2006, the entire contents of which are hereby incorporated by reference.

BACKGROUND

1. Field

This disclosure relates to a light emitting device and a manufacturing method thereof.

2. Related Art

An organic light emitting device among flat panel display devices is a self luminescent display device that emits light by electrically exciting an organic compound. Because an LCD using an organic light emitting device does not require a backlight, a decrease in weight and thickness of the LCD is possible and manufacturing processes can be simplified. Further, the organic light emitting device can be manufactured in a low temperature, has a high response speed of 1 ms or less, and has characteristics such as low power consumption, a wide viewing angle, and a high contrast.

The organic light emitting device comprises an organic emitting layer between an anode and a cathode. The organic light emitting device forms an exciton, which is a hole-electron pair, by coupling a hole received from the anode and an electron received from the cathode within the organic light emitting layer and emits light by generating energy when the exciton returns to a ground level.

The organic light emitting device is divided into a top emission type and a bottom emission type depending on the emission direction of light generated from the organic emitting layer. In a case where an organic light emitting device, comprising a pixel driving circuit, is a bottom emission type, the aperture ratio is seriously limited because the pixel driving circuit occupies a wide area of the substrate. Accordingly, in order to improve the aperture ratio, a top emission type organic light emitting device was introduced.

FIG. 1 is a cross-sectional view of a light emitting device in the related art. Referring to FIG. 1, a buffer layer 105 is positioned on the substrate 100 and a gate electrode 110 is positioned on the buffer layer 105. The first insulating layer 115, which is a gate insulating layer, is positioned on the gate electrode 110. An amorphous silicon layer 120 is positioned on the first insulating layer 115 so that a predetermined area thereof may correspond to the gate electrode 110.

Ohmic layers 125a and 125b, defining a source area and a drain area, are positioned on the predetermined area of the amorphous silicon layer 120. The ohmic layers 125a and 125b may comprise amorphous silicon in which impurity ions are injected.

The source electrode and the drain electrode 130a and 130b are positioned on the ohmic layers 125a and 125b. The second insulating layer 140, comprising a via hole 145 for exposing a portion of the drain electrode 130b, is positioned on the substrate comprising the source electrode and the drain electrode 130a and 130b.

The first electrode 150, electrically connected to the drain electrode 130b through the via hole 145, is positioned on the second insulating layer 140. The first electrode 150 may be an anode or a cathode. When the first electrode 150 is an anode, the first electrode 150 may comprise a transparent conductive layer such as Indium Tin Oxide (ITO), Indium Zinc Oxide (IZO), Indium Cerium Oxide (ICO), or Zinc Oxide (ZnO). When the first electrode 150 is a cathode, the first electrode 150 may comprise magnesium (Mg), silver (Ag), aluminum (Al), calcium (Ca), or alloys thereof.

A fourth insulating layer 160, comprising an opening 165 for exposing a portion of the first electrode 150, is positioned on the substrate comprising the first electrode 150. An organic emitting layer 170 is positioned within the opening 165 and a second electrode 180 is positioned on the substrate comprising the organic emitting layer 170.

At least six mask processes are required to manufacture an organic light emitting device having the above structure. That is, a gate electrode, an amorphous silicon layer and ohmic layer, a source electrode and drain electrode, a via hole, a first electrode, and an opening are formed by stacking layers made of a predetermined material and then etching the layers using a mask.

The number of masks required for a process increases manufacturing costs increases and the process time is lengthened.

SUMMARY

An object of this document is to provide a light emitting device and a method of manufacturing the same that can reduce a process time and a manufacturing cost.

In an aspect, a light emitting device comprises a substrate and a gate electrode positioned on the substrate. A first insulating layer is positioned on the substrate comprising the gate electrode. An amorphous silicon layer is positioned on the first insulating layer so that a predetermined area thereof corresponds to the gate electrode. Ohmic layers are positioned on a predetermined area of the amorphous silicon layer. The ohmic layers define a source area and a drain area. A source electrode or a drain electrode is electrically connected to one of the ohmic layers and a cathode is electrically connected to the other one of the ohmic layers. A second insulating layer is positioned on the substrate comprising the source electrode or the drain electrode and the cathode. The second insulating layer comprises an opening exposing a portion of the cathode. An emitting layer is positioned within the opening and an anode is positioned on the substrate comprising the emitting layer.

The source electrode or the drain electrode and the cathode may comprise magnesium (Mg), silver (Ag), aluminum (Al), calcium (Ca), and alloys thereof.

In another aspect, a method of manufacturing a light emitting device comprises preparing a substrate and forming a gate electrode on the substrate. A first insulating layer is stacked on the substrate comprising the gate electrode. An amorphous silicon layer and an ohmic layer are stacked on the first insulating layer. The amorphous silicon layer and the ohmic layer are patterned. A metal layer is stacked on the substrate comprising the patterned ohmic layer. A source area and a drain area are defined and a source electrode or a drain electrode is electrically connected to one of the source area and the drain area and a cathode is electrically connected to the other one of the source area and the drain area, by etching a portion of the metal layer and the ohmic layer. A second insulating layer is stacked on the substrate comprising the source electrode or the drain electrode and the cathode. An opening is formed exposing a portion of the cathode by etching the second insulating layer. A emitting layer is formed within the opening and an anode is formed on the substrate comprising the emitting layer.

BRIEF DESCRIPTION OF THE DRAWINGS

The implementation of this disclosure will be described in detail with reference to the following drawings in which like numerals refer to like elements.

DETAILED DESCRIPTION

Figure 1:
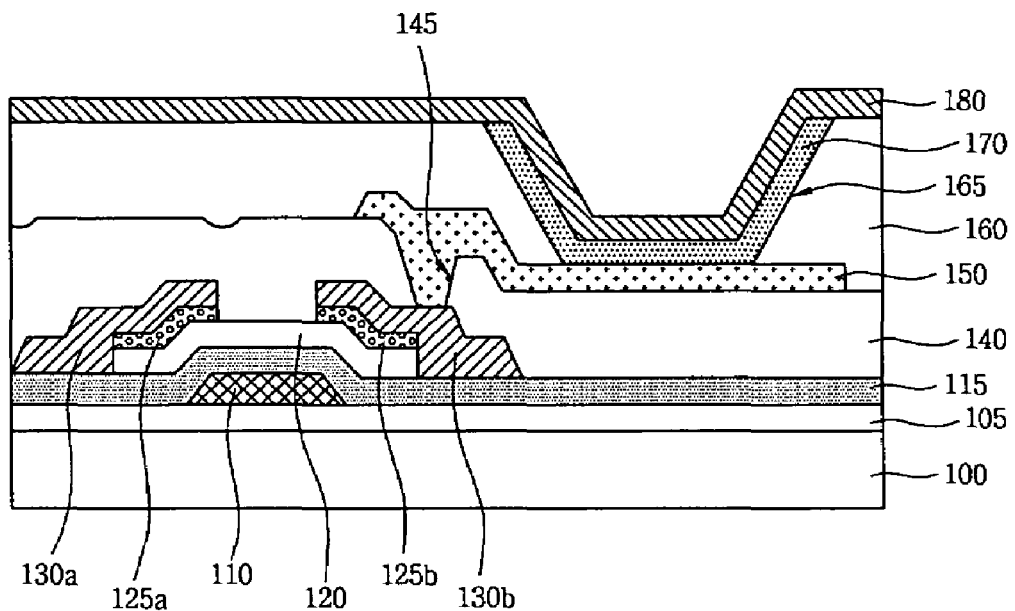
FIG. 1 is a cross-sectional view of a light emitting device in the related art.

Hereinafter, implementations of this disclosure will be described in detail with reference to the attached drawings. However, this disclosure is not limited to the implementations, but may be embodied in various forms. In the drawings, when it is said that a layer is positioned "on" another layer or a substrate, on another part, it means the layer may be directly formed on the other layer or the substrate or above the other layer with a third layer. Like reference numerals designate like elements throughout the specification.

Figure 2:
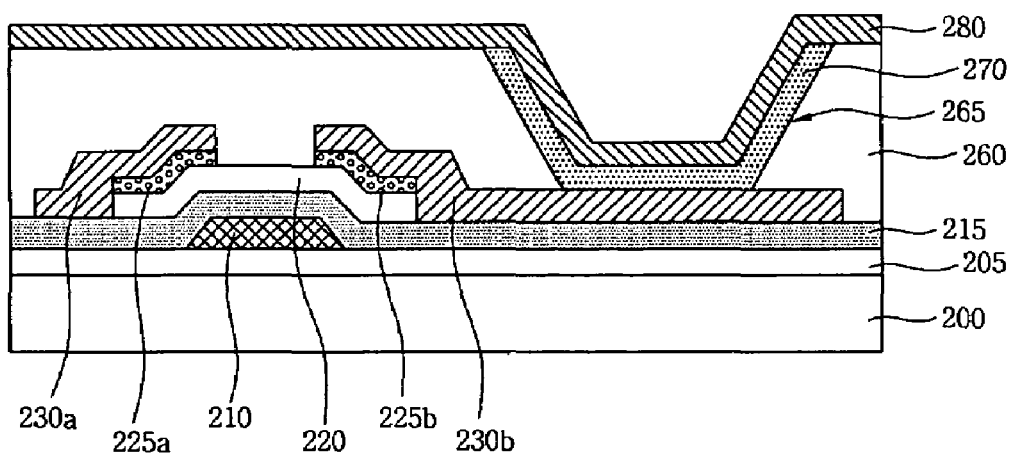
FIG. 2 is a cross-sectional view of an implementation of light emitting devices.

FIG. 2 is a cross-sectional view of an implementation of the light emitting device. Referring to FIG. 2, a buffer layer 205 is positioned on the substrate 200 and a gate electrode 210 is positioned on the buffer layer 205. A first insulating layer 215 is positioned on the substrate comprising the gate electrode 210, and an amorphous silicon layer 220 is positioned on the first insulating layer 215 so that a predetermined area thereof corresponds to the gate electrode 210.

Ohmic layers 225a and 225b defining a source area and a drain area are positioned on the predetermined area of the amorphous silicon layer 220. The source electrode 230a, electrically connected to one of the ohmic layers 225a and 225b, and the first electrode 230b, electrically connected to the other one of the ohmic layers 225a and 225b, are disposed or positioned on the ohmic layers 225a and 225b. The first electrode 230b may be a cathode and the first electrode 230b also performs a function of a drain electrode.

The second insulating layer 260, comprising an opening 265 exposing a portion of the first electrode 230b, is positioned on the substrate comprising the source electrode 230a and the first electrode 230b. An emitting layer 270 is positioned within the opening 265, and a second electrode 280 is positioned on the substrate comprising the emitting layer 270. The second electrodes 280 may be an anode.

Hereinafter, referring to FIGS. 3A to 3F, a manufacturing method of an implementation of the light emitting devices having the above structure will be described.

FIGS. 3A to 3F are cross-sectional views for each process explaining a manufacturing method of the implementation of the light emitting devices.

Figure 3A:
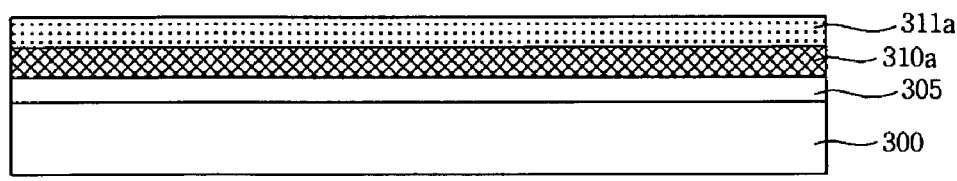
FIGS. 3A to 3F are cross-sectional views for each process explaining a manufacturing method of an implementation of the light emitting devices.

Referring to FIG. 3A, a buffer layer 305 is formed on a substrate 300 made of glass, plastic, or metal. The buffer layer 305 is formed so as to protect a thin layer transistor to be formed at subsequent processes from impurities such as an alkali ion diffused from the substrate 300 and is selectively formed using silicon oxide ($SiO_2$), silicon nitride (SiNx), etc.

Next, a first metal layer 310a is stacked so as to form a gate electrode on the buffer layer 305. The first metal layer 310a is made of one selected from a group consisting of aluminum (Al), aluminum alloy (Al alloy), molybdenum (Mo), molybdenum alloy (Mo alloy) and preferably, the first metal layer 310a is made of molybdenum-tungsten alloy. In order to pattern the first metal layer 310a, a photoresist 311a is coated on the first metal layer 310a.

Figure 3B:
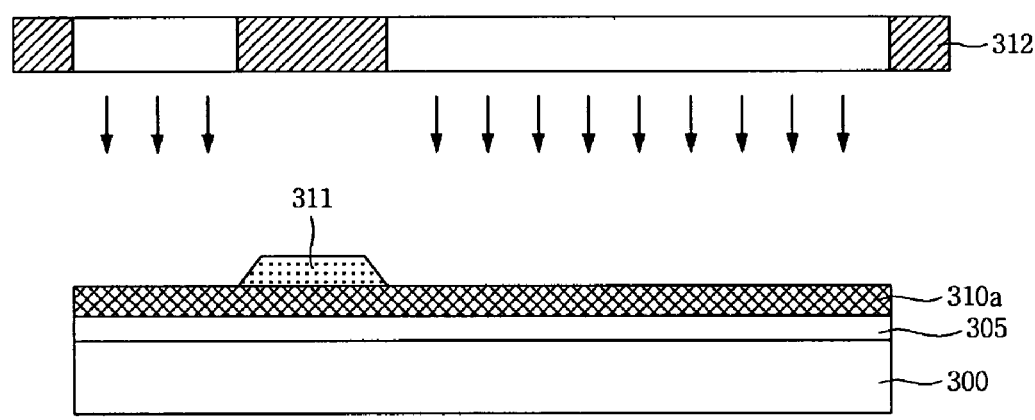

Referring to FIG. 3B, a predetermined area of the photoresist is exposed using a first mask 312. Thereafter, a photo mask 311 corresponding to a predetermined area of the first metal layer 310a is formed in a predetermined area thereof by developing an exposed photoresist.

Figure 3C:
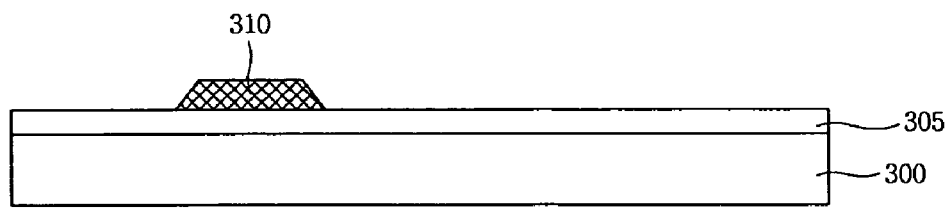

Referring to FIG. 3C, a gate electrode 310 is formed by etching the first metal layer 310a using the photo mask 311. Thereafter, the photo mask used for etching is removed by ashing or striping. Below, the description of the mask processes will be omitted.

Figure 3D:
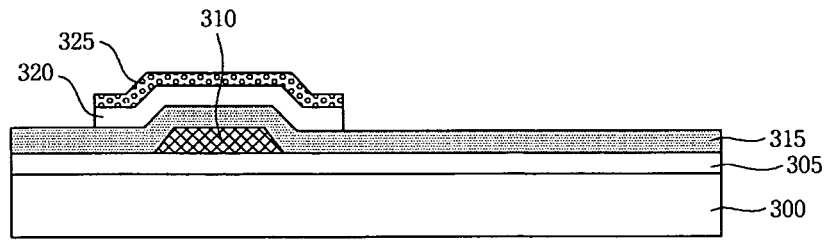

Referring to FIG. 3D, a first insulating layer 315, which is a gate insulating layer, is stacked on the substrate comprising the gate electrode 310. The first insulating layer 315 may comprise a silicon oxide layer, a silicon nitride layer, or a double layer thereof.

An amorphous silicon layer 320 and an ohmic layer 325 are sequentially stacked on the first insulating layer 315. The ohmic layer 325 may be an amorphous silicon layer in which p-type impurity ions are injected. The p-type impurity may be selected from a group consisting of boron (B), aluminum (Al), gallium (Ga), and indium (In).

In an implementation of this document, an amorphous silicon layer in which p-type impurity ions are injected is used, but an amorphous silicon layer in which n-type impurity ions are injected may be used. The n-type impurity ion may be selected from a group consisting of phosphorus (P), arsenic (As), antimony (Sb), and bismuth (Bi). Thereafter, the amorphous silicon layer 320 and the ohmic layer 325 are patterned using a second mask (not shown).

Figure 3E:
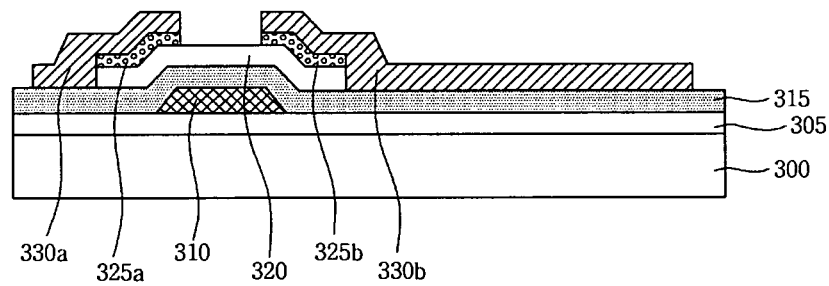

Referring to FIG. 3E, a second metal layer is stacked on the substrate comprising the patterned ohmic layer 325. In the second metal layer, magnesium (Mg), silver (Ag), aluminum (Al), calcium (Ca), or alloys thereof having low resistance and work function may be used. Next, by patterning a portion of the ohmic layer and the second metal layer using a third mask (not shown), the source area and the drain area 325a and 325b are defined and at the same time, a source electrode 330a and a first electrode 330b, electrically connected to the source area and the drain area 325a and 325b, are formed. At this time, in order to selectively etch a portion of the ohmic layer, a half-tone mask process can be used.

The first electrode 330b also performs a function of a drain electrode. That is, the first electrode 330b is electrically connected to the drain area 325b and formed within a unit pixel area. The first electrodes 330b formed in the unit pixel areas are separated from each other. Further, the first electrode 330b comprises a metal having low resistance and work function. The first electrode 330b may be a cathode.

Figure 3F:
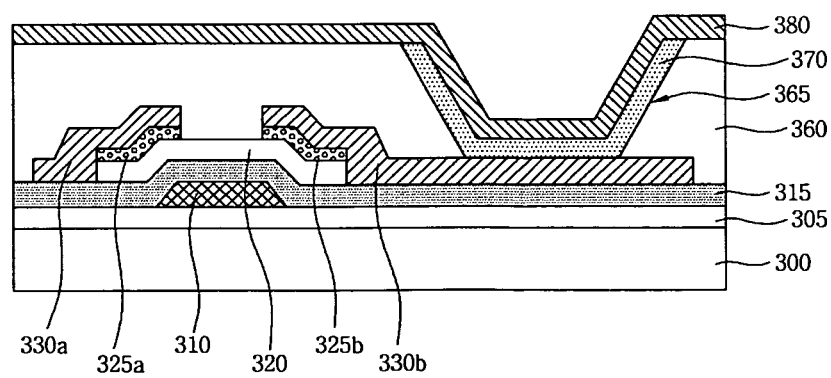

Referring to FIG. 3F, a second insulating layer 360, which is a pixel defining layer, is formed on the substrate comprising the source electrode 330a and the first electrode 330b. The second insulating layer 360 may be an organic layer made of polyimide, poly acryl, and benzocyclobutene resin, etc. Further, the second insulating layer 360 may be an inorganic layer made of silicon nitride or silicon oxide.

Thereafter, an opening 365 exposing a portion of the first electrode 330b is formed by etching the second insulating layer 360 using a fourth mask (not shown). An organic emitting layer 370 is formed within the opening 365. Although not shown in FIG. 3E, an electron injection layer and an electron transport layer may be interposed between the organic emitting layer 370 and the first electrode 330b, which is a cathode, and a hole transport layer and a hole injection layer may be positioned on the organic emitting layer 370.

A second electrode 380 is formed on the substrate comprising the organic emitting layer 370. The second electrodes 380 may be an anode. Accordingly, the second electrode 380 may comprise a transparent conductive layer such as Indium Tin Oxide (ITO), Indium Zinc Oxide (IZO), Indium Cerium Oxide (ICO), or Zinc Oxide (ZnO).

As described above, the source electrode (or drain electrode) and the first electrode of a light emitting device in an implementation of this document are formed at the same time using an identical material and the first electrode also performs a function of a drain electrode (or source electrode). Accordingly, stacking of a metal layer for the first electrode and a patterning process of the first electrode can be reduced.

Further, in the implementation of the light emitting devices, an insulating layer stacking process for insulating the first electrode from a conventional source electrode and drain electrode and a via hole forming process for electrically connecting the first electrode from a drain electrode (or source electrode) are not required.

Therefore, in an implementation of the light emitting devices, a process time required when manufacturing the light emitting device can be reduced, and two masks can be reduced, compared to the related art.

Figure 4A:
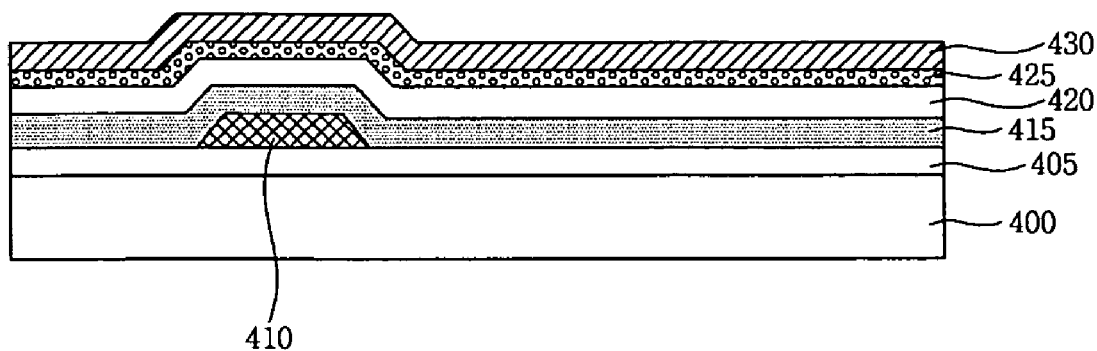
FIGS. 4A and 4B are cross-sectional views for each process explaining a manufacturing method of another implementation of light emitting devices.
Figure 4B:
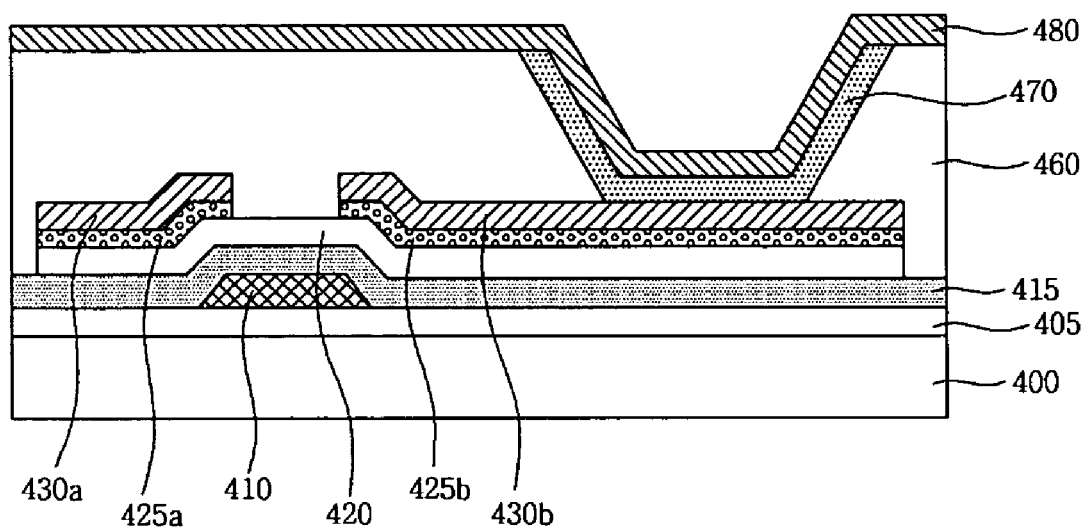

FIGS. 4A and 4B are cross-sectional views for each process explaining a manufacturing method of the implementation of the light emitting devices. Another implementation of the light emitting devices is manufactured with a method equal to that of the light emitting device in an implementation of this document except processes described in the following description.

Referring to FIG. 4A, an amorphous silicon layer 420, an ohmic layer 425, and a metal layer 430 are sequentially stacked on a substrate 400 in which a buffer layer 405, a gate electrode 410, a first insulating layer 415 are stacked.

Referring to FIG. 4B, by selectively etching the amorphous silicon layer, the ohmic layer, and the metal layer through a half-tone mask process, a source area and a drain area 425a and 425b are defined and at the same time, the first electrode 430b positioned on the drain area 425b and a source electrode 430a positioned on the source area 425a are formed.

The first electrode 430b also performs a function of a drain electrode and the first electrode 430b may be a cathode.

As described above, in another implementation of this document, by simultaneously etching an amorphous silicon layer, an ohmic layer, and a metal layer, a source area and a drain area are defined and at the same time, a source electrode and a first electrode are formed. Therefore, another implementation of the light emitting devices can be manufactured using three masks.

The invention being thus described, it will be obvious that the same may be varied in many ways. Such variations are not to be regarded as a departure from the spirit and scope of the invention, and all such modifications as would be obvious to one skilled in the art are intended to be comprised within the scope of the following claims.

What is claimed is:

1. An organic light emitting device comprising:
a substrate;
a gate electrode formed on the substrate;
a first insulating layer formed on the substrate comprising the gate electrode;
an amorphous silicon layer formed on the first insulating layer
ohmic layers formed on the amorphous silicon layer, the ohmic layers defining a source area and a drain area;
a source and a drain electrode formed on the ohmic layers;
a cathode formed on a pixel area, wherein the cathode is extended from the drain electrode and formed of the same layer as the drain electrode;
a second insulating formed on the substrate, wherein the second insulating layer comprises an opening exposing a portion of the cathode;
an emitting layer formed on the opening; and
an anode formed on the substrate comprising the emitting layer.

2. The organic light emitting device of claim 1, wherein the source electrode or the drain electrode and the cathode comprise at least one selected from a group consisting of magnesium (Mg), silver (Ag), aluminum (Al), calcium (Ca), and alloys thereof.

3. The organic light emitting device of claim 1, wherein the anode comprises at least one selected from a group consisting of ITO (Indium Tin Oxide), IZO (Indium Zinc Oxide), ICO (Indium Cerium Oxide), and ZnO (Zinc Oxide).

4. The organic light emitting device of claim 1, wherein the ohmic layers comprise an amorphous silicon layer in which impurity ions are injected.

5. The organic light emitting device of claim 4, wherein the impurity ion is a p-type or n-type impurity ion.

6. The organic light emitting device of claim 1, wherein at least one of an electron injection layer or an electron transport layer is interposed between the cathode and the emitting layer.

7. The organic light emitting device of claim 1, wherein at least one of a hole injection layer or a hole transport layer is interposed between the anode and the emitting layer.

8. The organic light emitting device of claim 1, wherein the emitting layer comprises an organic material.

9. The organic light emitting device of claim 1, wherein the amorphous silicon layer and the ohmic layer have substantially same shape with the cathode.

10. The organic light emitting device of claim 1, wherein the second insulating layer comprises an organic layer.

11. The organic light emitting device of claim 10, wherein the organic layer comprises any one selected from a group consisting of polyimide, poly acryl, and benzocyclobutene resin.

12. The organic light emitting device of claim 1, wherein the second insulating layer comprises an inorganic layer.

13. The organic light emitting device of claim 12, wherein the second insulating layer comprises silicon nitride or silicon oxide.

* * * * *